United States Patent [19]

Kumata

[11] 4,064,468
[45] Dec. 20, 1977

[54] LOW VOLTAGE COMPENSATOR FOR POWER SUPPLY IN A COMPLEMENTARY MOS TRANSISTOR CRYSTAL OSCILLATOR CIRCUIT

[75] Inventor: Kiyoshi Kumata, Tenri, Japan

[73] Assignee: Sharp Kabushiki Kaisha, Osaka, Japan

[21] Appl. No.: 718,069

[22] Filed: Aug. 26, 1976

[30] Foreign Application Priority Data

Aug. 29, 1975 Japan ............................... 50-105386

[51] Int. Cl.² .............................................. H03B 5/36
[52] U.S. Cl. ............................. 331/116 R; 58/23 AC; 331/185
[58] Field of Search ........................... 331/116 R, 185; 58/23 R, 23 A, 23 AC

[56] References Cited

U.S. PATENT DOCUMENTS 3,725,822  4/1973  Eaton, Jr. ..................... 331/116 R X
3,855,549  12/1974  Huener et al. ............... 331/116 R X Primary Examiner—Siegfried H. Grimm
Attorney, Agent, or Firm—Birch, Stewart, Kolasch & Birch

[57] ABSTRACT

A resistor is connected to the source of a C-MOS inverter included within a crystal oscillator circuit in order to reduce the power dissipation in the crystal oscillator circuit. A switching transistor responsive to the voltage reduction of a power supply source is connected to said resistor in a parallel fashion, thereby shunting the resistor when the power supply level is below a predetermined value.

4 Claims, 2 Drawing Figures

LOW VOLTAGE COMPENSATOR FOR POWER SUPPLY IN A COMPLEMENTARY MOS TRANSISTOR CRYSTAL OSCILLATOR CIRCUIT

BACKGROUND OF THE INVENTION

The present invention relates to a complementary MOS transistor crystal oscillator circuit and, more particularly, to a low voltage compensator the power supply in a complementary MOS transistor crystal oscillator circuit.

A C-MOS circuit is conventionally used in an electronic device which requires low power dissipation, especially, in an electronic wristwatch employing a battery of low capacitance.

In an electronic timepiece, a C-MOS crystal oscillator circuit is usually employed, wherein a large part of power in the total power dissipation is consumed, because the C-MOS crystal oscillator circuit operates at very high frequencies in an electronic timepiece. Thereafter, it is required to reduce the power dissipation in the C-MOS crystal oscillator circuit in order to minimize the total power dissipation in the electronic timepiece.

To this end, it has been proposed to connect a resistor to the source of the transistor included within a C-MOS inverter employed in the crystal oscillator circuit, thereby limiting the current flowing through the C-MOS inverter. However, a voltage $V_D$ applied to the C-MOS inverter is unavoidably decreased by a voltage reduction $V_S$ at the resistor. That is, $V_D = V_{DD} - V_S$, when a power supply level is $V_{DD}$ and the $V_{SS}$ is maintained at ground potential. Therefore, the permissible low voltage for the C-MOS inverter must be selected at a level lower than that of the crystal oscillator circuit by the voltage reduction $V_S$ at the resistor connected to the source of the C-MOS inverter. This results in a requirement that the gain of the C-MOS inverter must be considerably high.

OBJECTS AND SUMMARY OF THE INVENTION

Accordingly, an object of the present invention is to provide a complementary MOS transistor crystal oscillator circuit with low power characteristics.

Another object of the present invention is to provide a complementary MOS transistor crystal oscillator circuit which can stably operate without regard to the variation of the power supply voltage.

Still another object of the present invention is to provide a low voltage compensator for the power supply in a complementary MOS transistor crystal oscillator circuit employed in an electronic wristwatch.

Other objects and further scope of applicability of the present invention will become apparent from the detailed description given hereinafter. It should be understood, however, that the detailed description and specific examples, while indicating preferred embodiments of invention, are given by way of illustration only, since various changes and modifications within the spirit and scope of the invention will become apparent to those skilled in the art from this detailed description.

To achieve the above objects, pursuant to an embodiment of the present invention, a switching transistor responsive to the voltage reduction of a power supply source is connected, in a parallel fashion, to a resistor connected to the source of a transistor included within a C-MOS inverter employed in a crystal oscillator circuit.

The switching transistor is maintained off when a power source voltage $V_{DD}$ is above a predetermined value, thereby limiting the current flowing through the C-MOS inverter with the use of the resistor connected to the source of the transistor included within the C-MOS inverter. When a power source voltage $v_{DD}$ is below the predetermined value, the switching transistor is closed, thereby shunting the resistor connected to the source of the transistor included within the C-MOS inverter. At this moment, the C-MOS inverter is connected directly to receive the power source voltage $V_{DD}$.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
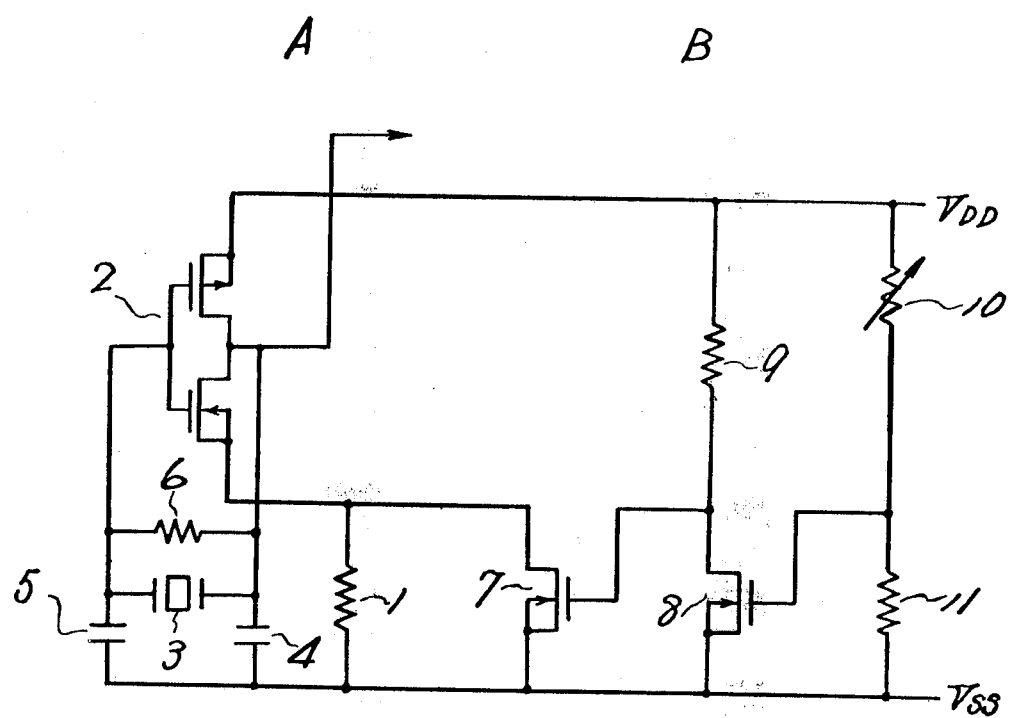
FIG. 1 is a circuit diagram of an embodiment of a complementary MOS transistor crystal oscillator circuit of the present invention.

Referring now to FIG. 1, there is illustrated an embodiment of the present invention, a complementary MOS transistor crystal oscillator circuit of the present invention mainly comprising a crystal oscillation circuit A and a switching circuit B.

The crystal oscillation circuit A comprises a C-MOS inverter 2, a resistor 1 connected to the source of the N-channel transistor included within the C-MOS inverter 2, a quartz crystal vibrator 3 connected between input and output terminals of the C-MOS inverter 2, a feedback circuit connected between the input and output terminals of the C-MOS inverter 2, said feedback circuit including a load capacitor 4 and an input site capacitor 5, and a feedback resistor 6 connected, in a parallel fashion, to the feedback circuit for controlling the switching level of the C-MOS inverter 2.

The switching circuit B comprises a switching transistor 7, a controlling transistor 8, a pull up resistor 9, and resistors 10 and 11 for determining the switching level. The switching transistor 7 is connected to the crystal oscillation circuit A in parallel to the source resistor 1.

When the resistance values of the resistors 10 and 11 are selected at $R_1$ and $R_2$, respectively, a gate level $V_G$ of the controlling transistor is calculated as follows in the case where $V_{SS} = 0V$.

$$V_G = (R_1/R_1 + R_2) V_{DD}$$

When the gate level $V_G$ is above the threshold level of the controlling transistor 8, the controlling transistor 8 in ON and, hence, the switching transistor 7 is OFF because the gate level of the transistor 7 is pulled down to 0V. Therefore, the current flowing through the crystal oscillation circuit A is limited by the source resistor 1.

When the gate level $V_G$ of the controlling transistor 8 is below its threshold level due to the reduction of the power supply voltage $V_{DD}$, the controlling transistor 8 is OFF and, hence, the gate level of the switching transistor 7 is pulled up toward the power supply voltage $V_{DD}$. This places the gate level of the switching transistor 7 above its threshold level and, therefore, the switching transistor 7 becomes ON. At this moment, the power supply voltage $V_{DD}$ is applied directly to the C-MOS inverter 2, since the ON-resistance of the transistor 7 is considerably lower as compared with the resistance value of the source resistor 1.

It will be clear from the foregoing description that the crystal oscillation circuit A can operate well even when the power supply voltage $V_{DD}$ is undesirably reduced. Moreover, the C-MOS inverter 2 can be made of transistors of low gain.

In the foregoing embodiment, the resistor 10 is made of a variable resistor in order to facilitate the setting of the switching level. However, the resistors 10 and 11 can be made of fixed resistors. In this case the switching circuit B can be easily incorporated within an LSI circuit.

Figure 2:
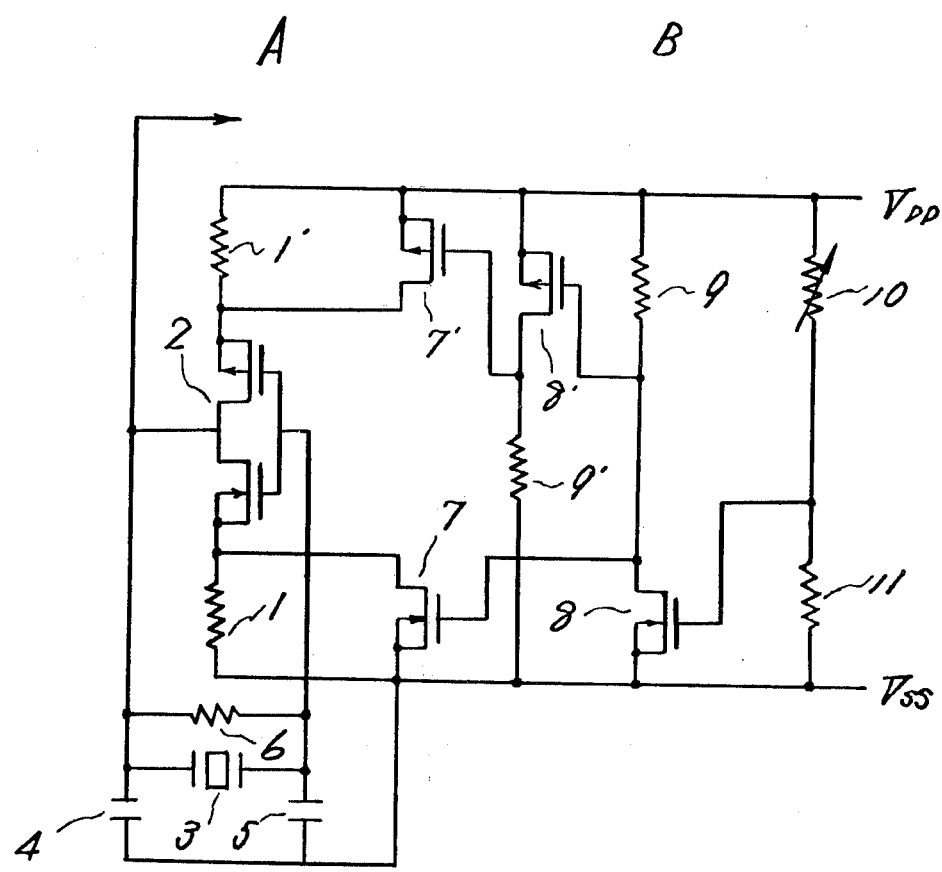
FIG. 2 is a circuit diagram of another embodiment of a complementary MOS transistor crystal oscillator circuit of the present invention.

FIG. 2 shows another embodiment of the present invention, wherein resistors are connected to the sources of the two transistors included within the C-MOS inverter in order to stabilize the operation of the C-MOS inverter. Like elements corresponding to those of FIG. 1 are indicated by the like numerals.

The crystal oscillation circuit A comprises the C-MOS inverter 2, quartz crystal vibrator 3, the feed back loop including the capacitors 4 and 5, and the feedback resistor 6. The crystal oscillation circuit A further comprises the resistor 1 connected to the source of the N-channel transistor included within the C-MOS inverter 2, and another resistor 1' connected to the source of the P-channel transistor included within the C-MOS inverter 2. The resistors 1 and 1' function, in combination, to limit the current flowing through the C-MOS inverter 2 and stabilize the operation point of the C-MOS inverter 2.

The switching circuit B comprises the N-type switching transistor 7 connected to the source of the N-channel transistor of the C-MOS inverter 2 in parallel to the source resistor 1, a P-type switching transistor 7' connected to the source of the P-channel transistor of the C-MOS inverter 2 in parallel to the source resistor 1', a controlling transistor 8, another controlling transistor 8', a pull up resistor 9, a pull down resistor 9', and resistors 10 and 11 for determining the switching level.

When the power supply voltage $V_{DD}$ is sufficiently high, the gate level of the controlling transistor 8 is above its threshold level and, hence, the transistor 8 is ON. The gate levels of the transistors 7 and 8' are pulled toward the $V_{SS}$ and, therefore, the transistor 7 is OFF and the transistor 8' is ON. The gate level of the transistor 7' is pulled toward the power supply voltage $V_{DD}$ and, hence, the transistor 7' is OFF. The source resistors 1 and 1' are inserted in the circuit, since the transistors 7 and 7' are OFF, thereby limiting the current flowing through the C-MOS inverter 2.

Conversely, when the gate level of the controlling transistor 8 is below its threshold level due to the reduction of the power supply voltage $V_{DD}$, the controlling transistor 8 is OFF and, hence, the gate levels of the transistors 7 and 8' are pulled toward the power supply voltage $V_{DD}$. Therefore, the switching transistor 7 is ON, and the controlling transistor 8' is OFF. The gate level of the switching transistor 7' is pulled toward $V_{SS}$ because the controlling transistor 8' is OFF and, therefore, the switching transistor 7' becomes ON. Under these conditions, the source resistors 1 and 1' are shunted, whereby the power supply voltage $V_{DD}$ is applied directly to the C-MOS inverter 2.

In still another form, the switching levels of the controlling transistors 8 and 8' can be selected at different values, thereby controlling the resistance value connected to the C-MOS inverter 2 at two different values.

The abovementioned crystal oscillator circuit of the present invention is effectively applied to an electronic apparatus of which the power supply voltage is unavoidably variable over a considerably large range, such as in an electronic wristwatch having an LED display or an illumination lamp for a liquid crystal display.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a complementary MOS transistor crystal oscillator circuit including two power supply terminals, a C-MOS inverter connected across said two power supply terminals, a quartz crystal vibrator connected between an input terminal and an output terminal of said C-MOS inverter, and a source resistor connected between the source of one transistor of the C-MOS inverter and one of said two power supply terminals, the improvement comprising:
    switching means connected in parallel with the source resistor for shunting said source resistor when said switching means is closed; and
    control means for closing the switching means when the power supply voltage is below a predetermined value.

2. The crystal oscillator circuit of claim 1, wherein the source resistor is connected between the source of an N-channel transistor of the C-MOS inverter and a grounded power supply terminal, and the switching means is an N-type transistor.

3. In a complementary MOS transistor crystal oscillator circuit including two power supply terminals, a C-MOS inverter connected across said two power supply terminals, a quartz crystal vibrator connected between an input terminal and an output terminal of said C-MOS inverter, a first source resistor having one end connected to the source of the N-channel transistor of the C-MOS inverter and the other end connected to one of said power supply terminals, and a second source resistor having one end connected to the source of the P-channel transistor of the C-MOS inverter and the other end connected to the other power supply terminal, the improvement comprising:
    a first switching means connected in parallel with said first source resistor for shunting said first source resistor when said switching means is closed;
    a second switching means connected in parallel with said second source resistor for shunting said second source resistor when said second switching means is closed; and
    control means for closing said first and second switching means when the power supply voltage is below a predetermined value.

4. The crystal oscillator circuit of claim 3, wherein the first switching means is an N-type transistor, and the second switching means is a P-type transistor.

* * * * *